United States Patent
Bach

(10) Patent No.: US 7,636,013 B2
(45) Date of Patent: Dec. 22, 2009

(54) METHOD AND INTEGRATED CIRCUIT INCLUDING AN AMPLIFIER CALIBRATION CIRCUIT

(75) Inventor: Elmar Bach, Villach (AT)

(73) Assignee: Infineon Technologies AG, Neubiberg (DE)

( * ) Notice: Subject to any disclaimer, the term of this patent is extended or adjusted under 35 U.S.C. 154(b) by 49 days.

(21) Appl. No.: 11/828,100

(22) Filed: Jul. 25, 2007

(65) Prior Publication Data
US 2009/0027116 A1  Jan. 29, 2009

(51) Int. Cl.
*H03F 1/02* (2006.01)
(52) U.S. Cl. ............................................. 330/2; 330/9
(58) Field of Classification Search .................... 330/2, 330/9, 129, 259
See application file for complete search history.

(56) References Cited

U.S. PATENT DOCUMENTS

| 5,508,656 | A  | * | 4/1996 | Jaffard et al. ............... 330/9 |
| 7,167,045 | B1 | * | 1/2007 | Son et al. ................. 330/130 |
| 7,420,410 | B2 | * | 9/2008 | Ohba ....................... 330/9 |

* cited by examiner

*Primary Examiner*—Robert Pascal
*Assistant Examiner*—Hieu P Nguyen
(74) *Attorney, Agent, or Firm*—Dicke, Billig & Czaja, PLLC

(57) ABSTRACT

An integrated circuit including a circuit for calibration and offset compensation of an amplifier method is disclosed. In one embodiment, the method includes providing a reference input signal to the input of an amplifier, coupling the output signal of the amplifier to a comparator circuit as a first input signal, providing a target signal to the comparator circuit as a second input signal, and increasing or decreasing a control signal provided to amplifier VGA corresponding to the output of the comparator circuit by one adjustment process of small process size.

22 Claims, 6 Drawing Sheets

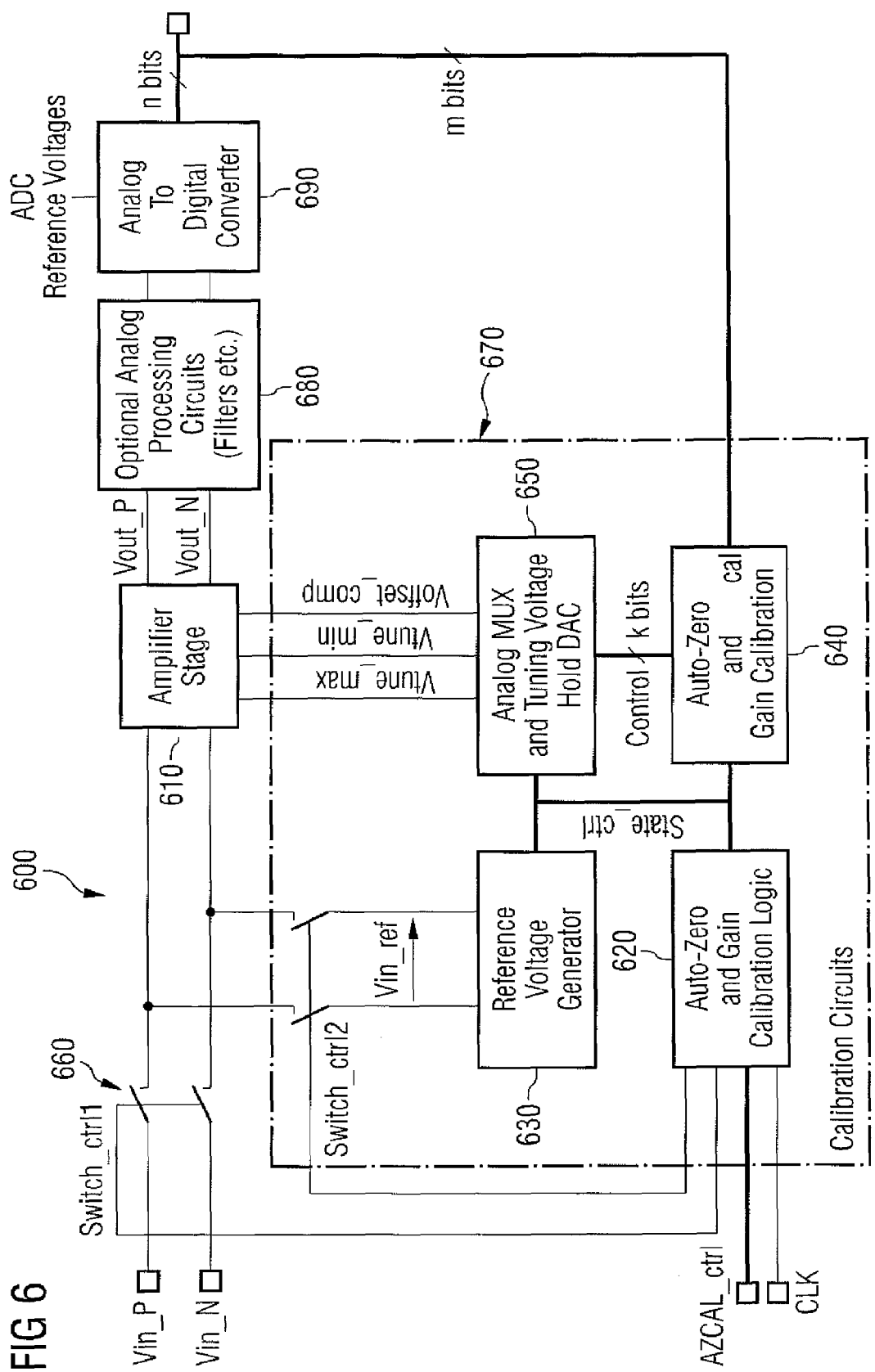

METHOD AND INTEGRATED CIRCUIT INCLUDING AN AMPLIFIER CALIBRATION CIRCUIT

BACKGROUND

This invention relates to the field of integrated circuits including high-speed amplifiers and their offset- and gain-calibration, in one embodiment high-speed variable gain amplifiers with adjustable gain.

High-speed amplifier circuits are used for amplifying the amplitude of signals. A variable gain amplifier (VGA) varies its gain depending on a control signal. To enable precise gains the endpoints of the gain curve are usually controlled to a high accuracy. This can be established for example by using a first control voltage to adjust the minimum gain and a second control voltage to control a maximum gain. Such high-speed amplifier circuits with variable gain can be used for example in read-circuits for computer hard disk drives.

When using VGAs with high frequencies there is limited bandwidth, wherein the bandwidth limitations become more stringent with increasing frequency due to increasing number of parasitic poles affecting the transfer function. VGA implementations in low speed applications are often based on a closed-loop approach wherein the gain is determined by the feedback ratio, e.g., using resistors in the feedback network. This feedback network includes parasitic poles that limit the maximum achievable bandwidth for stable operation. Such, at high operating frequencies, this technique suffers limited open-loop bandwidth and therefore limited closed-loop bandwidth. VGAs for extreme high speed applications are hence typically based on an open-loop approach that requires additional measures to enable a well controlled gain.

FIG. 1 illustrates a schematic circuit of a conventional high-speed amplification circuit 100. Basically the input signal to be amplified is fed into the circuit as a differential signal, i.e. with a positive component Vin_P and negative component Vin_N. The signal components are fed into a variable gain amplifier (VGA) 110 to produce an output signal, wherein the output signal may include a positive signal component Vout_P and a negative signal component Vout_N accordingly. The actual gain of the VGA can be adjusted by providing a control signal such as a voltage Vtune_max, which defines the maximum gain, and a second voltage Vtune_min for defining the minimum gain.

As illustrated in FIG. 1, an example for that extra gain-control circuitry is a parallel implementation (or more than one) 160, 161, of the open-loop amplifier 110 which is set to operate at required gain (or on more than one gain, e.g., maximum or minimum gain). These replica circuits 160, 161 are complimented by low-speed error amplifiers 180, 181 that are used to adjust gain setting tuning signals. Tuning signals can be e.g., voltages driving gain setting devices of the amplifiers into the desired operating state. In these conventional implementations considerable effort is necessary for adjusting a desired minimum and maximum gain. Furthermore components in these circuits are non-ideal, so that they may introduce parasitic effects, like offsets, into the gain control circuit that degrades the achievable gain accuracy. These parameters may also vary with temperature during operation.

Typically the VGA 110, 160, 161 can be composed of a set of transistors (either MOS or bipolar type or both) which may add an offset-voltage to the amplified output voltages Vout_P and Vout_N. The VGA 110 offers an input for a signal in order to compensate the offset-voltage, i.e. a control signal Offset_comp can be fed into the VGA for compensation.

Two methods are known to deduce the control signal Offset_comp. If the averaged input signals Vin_P and Vin_N are zero, then a low-pass filter can be coupled to the output for this purpose. Low frequency or direct voltage (DC) will pass the low pass filter, whereas a high frequency output signal will be blocked. In this way an offset compensation signal, e.g., a current or a voltage, can be derived based on the DC component at the output of the low-pass filter that serves as control signal for adjusting the offset of the VGA to zero. A drawback of this method is the long settling time for adjusting the control signal due to the required low cut-off frequency of the low-pass filter. The alternative as illustrated in FIG. 1 can be implemented.

In this alternative embodiment, the input signal, i.e. Vin_P and Vin_N, can be decoupled from the VGA for example by switches 120, and the input terminals of VGA 110 can be shorted by switch 130. The short of the input terminals enforces a zero signal at the input terminals of VGA 110. Ideally the output signal should be zero, i.e. there should be no voltage between the output terminals. Auto-zero block 140, which is connected to the output terminals of the VGA, generates a control signal Offset_comp fed into VGA 110, typically a control voltage, in order to compensate any offset voltage at the output of the VGA. As in this auto-zero calibration interval there is no input signal fed into the VGA, the time for settling the control voltage Offset_comp has to be short to minimize the duration of the auto-zero phase. In one form the auto-zero block 140 can be implemented as an OpAmp operating in closed-loop and settling the output offset of the VGA 110 to zero by generating a control signal Offset_comp accordingly. The value of signal Offset_comp can be stored on analog hold circuits, e.g., capacitors. Analogue elements such as capacitors simply loose their charge, so that the auto-zero interval must be repeated regularly to adjust the value of Offset_comp. Due to the non-ideal nature of the components their characteristics may change for example depending on temperature. Repetitive auto-zero phases will cope for these variations. Alternatively, a successive approximation approach can be used instead of a OpAmp including a comparator, a Digital-to-Analog Converter (DAC) and some control logic. Such the signal Offset_comp is static after the DAC is settled to the required output value. This relaxes hold circuit requirements but does not remove the requirement for updates of the signal Offset_comp to cope for variations of the VGA output offset. Furthermore, a more sophisticated control structure has to be applied, e.g., by providing proper clock signals to the DAC, comparator and local control logic.

For generating the gain control signals, for example control voltages, to adjust the minimum gain and the maximum gain of the VGA the circuit of FIG. 1 includes a tuning voltage generator 150 as encircled by the dotted square. On the left hand side the tuning voltage generator 150 includes a first circuit portion generating a control signal Vtune_max for adjusting the maximum gain of VGA 110 and on its right hand side a second, identical circuit portion generating control signal Vtune_min for adjusting the minimum gain of the VGA 110. As these circuit portions include identical elements and are operated the same way, the following description relates to both of them.

The circuit portions are arranged outside of the signal path of the input signal to be processed and are nearly replicas of the VGA 110 in the signal path. The desired control signals Vtune_max and Vtune_min can be tuned in by providing a low reference voltage 150 to the input of the circuit portion generating the maximum gain control signal and by providing a high reference voltage 151 respectively to the input the circuit portion generating the low gain control signal respectively, and by comparing the output signal to a target value. This can be achieved with a voltage divider 170, 171 and a following operational amplifier 180, 181, which tunes in the desired control signal Vtune_max or Vtune_min. The voltage divider, e.g., operating in a differential manner, divides a first input voltage buffered from the VGA output and second input voltage buffered from the reference voltage applied to the VGA input. The resulting mid-voltages Verr and Vε will be zero if the ratio of these two voltages matches the ratio of the resistors in the voltage divider, which defines the gain.

For example, in case of the circuit portion generating the Vtune_max control signal, the lower voltage portion of divider 170 is coupled to the input of VGA 160 and thus to the low reference voltage Vref_L. If the output voltage of VGA 160 does not match the desired gain value and consequently does not output the desired voltage, then voltage divider 170 outputs an error signal Verr, which is fed into amplifier 180. Operational amplifier 180 outputs a corresponding signal, which is used as a control signal for adjusting the gain of VGA 160. As this VGA 160 is a replica of VGA 110, the control signal output from amplifier 180 can be used as a control signal for VGA 110.

Regarding the circuit portion generating the control signal for the minimum gain adjustment of VGA 110, the higher voltage portion of divider 171 is coupled to the reference voltage Vref_H. In analogy to the first circuit portion the control signal output from amplifier 181 can be used as control signal Vtune_min for adjusting the minimum gain value of VGA110.

In this way VGAs 160 and 161 comprised in the circuit portions emulate VGA 110 in order to generate the control signals Vtune_max and Vtune_min.

Offset voltages in the replicas as well as in the residual elements of the circuit portions have impact on generating the desired control signals Vtune_min and Vtune_max, in particular when generating high gain control signals. This is even tightened by designing the elements, i.e. transistors and resistors, in the amplification circuits as small as possible to minimize parasitic capacitances in order to achieve high bandwidths. Thus the elements are designed on small areas, which causes high offset voltages in comparison to the input signal voltage due to the imperfections of processing technologies.

For achieving control voltages the Vtune_max and Vtune_min the VGAs 160, 161 in most cases are exact copies of VGA 110 in the signal path.

The offset voltages of each circuit portion can be minimized by using chopper methods. For this purpose the replica circuits include switches 190 to 195 to cross-couple the input lines of the reference voltages Vref_L, Vref_H and to cross-couple the output voltages of the VGAs 160, 161 according to a chopper clock signal generated by a conventional clock signal generator 1100. As illustrated switches 190 to 195 are coupled to the chopper clock signal. According to the toggling chopper clock signal each of the switches 190 to 195 swaps the polarity of its output. Consequently the polarity of the input and output voltages of VGAs 160 and 161 toggle their polarity, and wherein buffers 1110 to 1113 buffer the voltages when toggling the signals. The output signals of the VGAs 160 and 161 and the reference voltages Vref_L and Vref_H, which are coupled to the input of VGAs 160 and 161, are toggled accordingly by switches 192 to 195, such that the input voltage of the dividers are not toggled.

Any offset voltage introduced by VGAs 160 and 161, which is the same throughout a chopper cycle, is thus modulated according to the chopper clock and adds to the error voltage Verr at the input of the amplifiers 180 and 181 respectively. The feedback loop also reflects the toggling in that the control signals Vtune_max_chop and Vtune_min_chop include an alternating component having the frequency of the chopper signal. As the alternating component must be removed before the output signals of the circuit portions are coupled to VGA 110, each of the circuit portions includes a low-pass filter 1120, 1121 removing the alternating component, such that the control signals Vtune_max and Vtune_min do not include an alternating component. This additional filtering increases the settling time of the control signals after powering up the entire circuit. If circuit 100 will be powered on and off regularly then it may become necessary to keep the circuit portions including the replica VGAs 160 and 161 powered on in order to avoid a long settling time after each power up, but which increases dissipation loss.

Another disadvantage of this circuit results from the fact that the circuit operates only as long as there is a linear correlation between the control signals and the gain of the VGAs. Usually this is the case within a limited range around an actual operating point, whereas large offset voltages result in a non-linear change of the control voltages, which causes different control voltages in the intervals of the chopper clock signal. This non-linearity cannot be removed by simply low-pass filtering the control signals, which thus causes distortions in the gain values of VGA 110. Additional effort has to be taken to avoid these effects, for example by integrating the error voltage Verr in the amplifiers 180 and 181 in order to reduce the amplitude of the swing of the control signal and thus to maintain a linear operation.

Also there are differences between VGA 110 and replica circuits VGAs 160, 161 by which a false error voltage Verr can be generated. As the bandwidth of an amplifier depends on the temperature and other factors there will be always a difference between VGA 110 and its replicas.

Due to the replica circuit portions, the auto-zero block 140 including switches 120, 130 the prior art circuit 100 consumes a large area on a chip, consumes much energy and is prone to gain deviations caused by varying temperature and production variations.

Hence there is a need for a new circuit for controlling the amplification of an input signal.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 6 illustrates schematics of an alternative auto-zero and gain calibration circuits using a digital approach involving an existing analog-to-digital converter.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The present invention will now be described with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances well known processes and steps have not been described in detail in order not to unnecessarily obscure the present invention.

Figure 2:
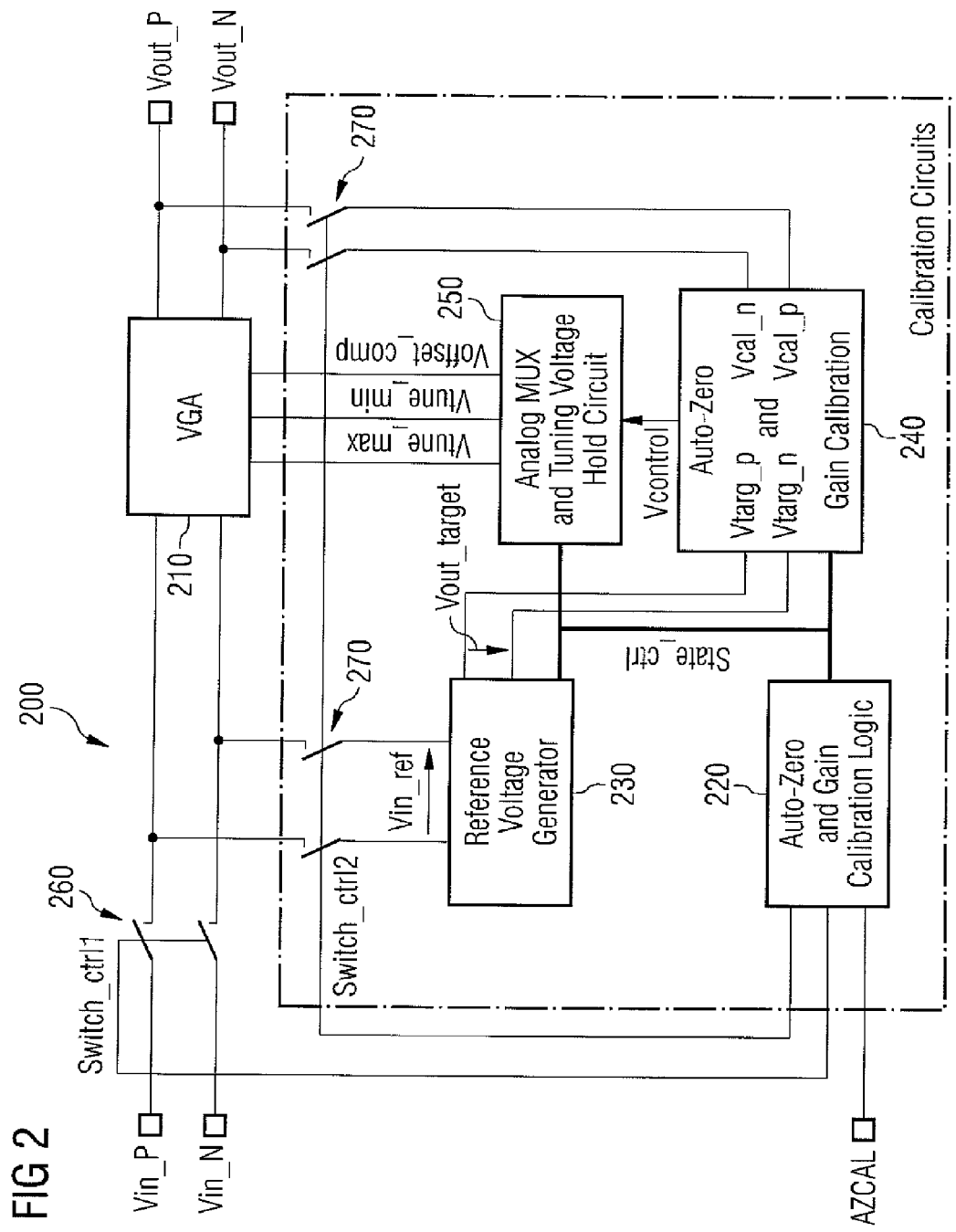
FIG. 2 illustrates a schematic overview of a circuit.

FIG. 2 illustrates an integrated circuit including a schematic circuit 200, wherein in this exemplifying embodiment the circuit is used to amplify an input signal in a variable gain amplifier (VGA) 210. Note that also fixed gain amplifiers can be used, for which an offset compensation can be determined.

The input signal, which is a differential signal including a first voltage Vin_P, which for example can be the positive portion, and a complementary voltage Vin_N, is fed into the variable gain amplifier 210. VGA 210 provides a gained output signal at its output terminals including signal portion Vout_P being, for example, a positive voltage, and signal portion Vout_N being the corresponding complementary signal portion.

However the input signal may be a non-differential signal, which is a signal on a single line with ground or any other potential as reference potential, wherein the reference potential is applied to the VGA. In this case the VGA includes only one terminal for the input signal to be processed and only one output terminal for the corresponding one output signal. An offset voltage in this case will occur between the output terminal and the reference potential accordingly. For compensating the offset voltage the below described circuits and methods can be applied.

Figure 1:
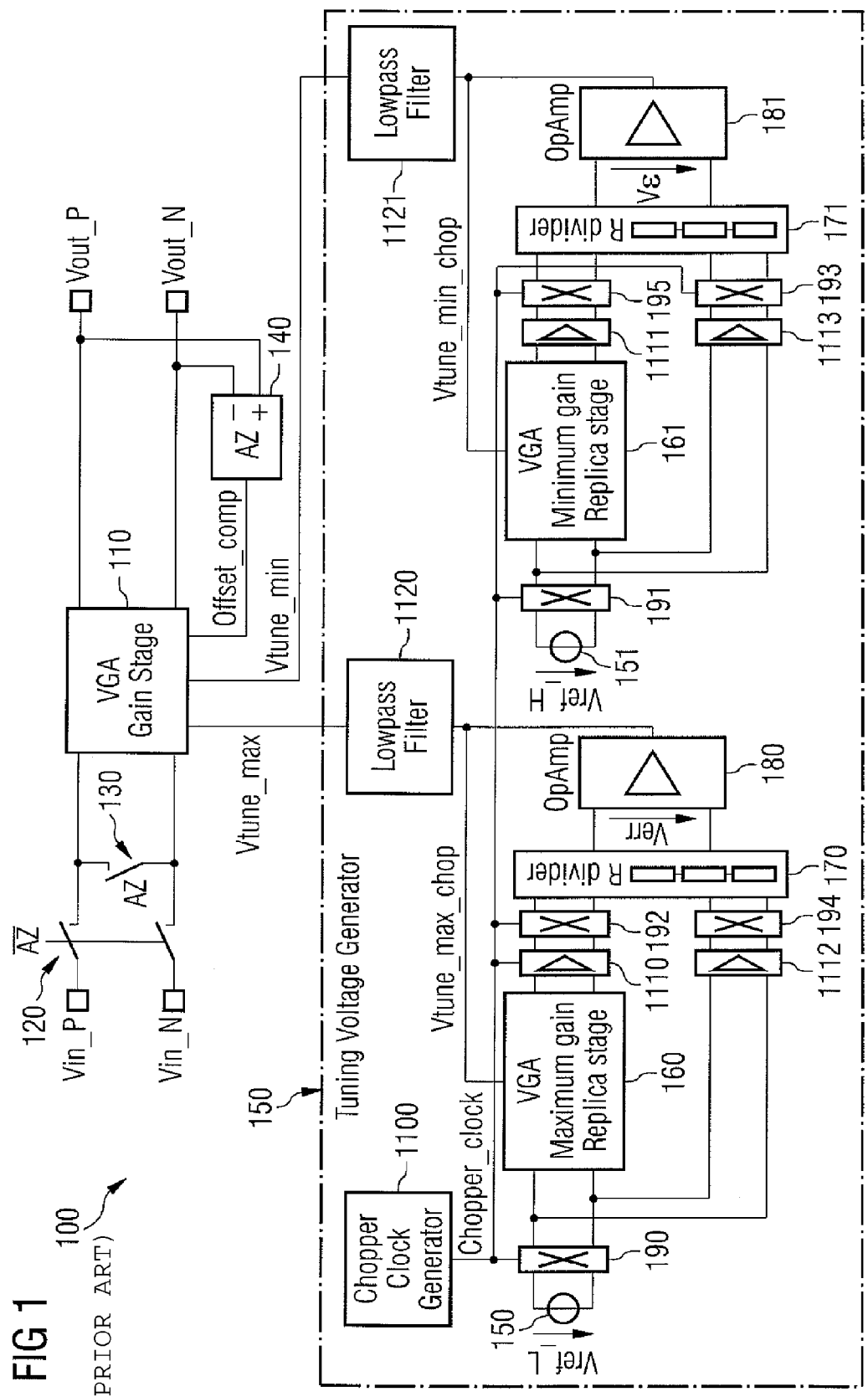
FIG. 1 illustrates a variable gain amplifier circuit of prior art including two replica circuit portions for generating control signals.

Similar to the VGA in the signal path of the above described prior art circuit this VGA 210 provides two input terminals for control signals Vtune_max and Vtune_min, which typically are control voltages, for adjusting a maximum gain value and a minimum gain value. Furthermore VGA 210 provides a third input terminal for a control signal Voffset_comp, which adjusts the offset voltage of VGA 210 and which thus compensates any output offset voltage to zero. VGA 210 thus illustrates the same properties as that in the signal path of FIG. 1.

The invention also relates to calibration circuits, as encircled by the dotted rectangle, for determining and generating the gain adjusting signals Vtune_max and Vtune_min and the offset adjusting signal Voffset_comp.

The elements of the calibration circuit and their function will now be described with reference to the schematic circuit, wherein functional components are exemplified by boxes. Some of them will be described in more detail further below.

The generation of the control signals can be performed in subsequent time intervals, wherein in each time interval one of the control signals Vtune_min or Vtune_max or Voffset_comp is determined. The sequence of the determination of the signals can be varied depending on, for example, which of the control signals drifts from its latest set value quickest. Alternatively, for example, on power up of the circuit or if desired, all control signals can be determined in one time interval, wherein the sequence may be varying. The time between two subsequent determinations of a value of one control signal depends on how fast the value will be outdated, wherein a value of a control signal can become outdated for example on characteristics depending on for example a varying temperature of the circuit. Furthermore such a calibration of a control signal can be repeated if the determined value cannot be stored non-dissipative. That is, if the determined and stored value changes its value for example due to leakage in a non-ideal storage element, then a new value can be determined and set.

The determination of the offset adjusting/compensating control signal can be performed as the control signal to be determined first, such that the subsequent determination of the gain control values Vtune_min and Vtune_max is not influenced by an offset voltage.

In the following a first mode for adjusting the values of the control signals will be described in more detail, which will be called initial mode subsequently. A time interval for determining a value of one of the control signals is started by setting the auto-zero and calibration signal AZCAL, which triggers the auto-zero and gain calibration logic 220, hereinafter named logic block 220, to begin a time interval. That block 220 connects via a communication line to a reference voltage generator 230, to an auto-zero and gain calibration block 240 and to an analogue MUX and tuning voltage hold block 250 and initiates the determination of a control signal value in these blocks.

For determining the offset compensation control signal Voffset_comp logic block 220 causes the switches 260 to open by setting an appropriate signal switch_ctrl1. At the same time switches 270 are closed by an appropriately set signal switch_ctrl2. In this way the input signal, i.e. signals Vin_P and Vin_N, are decoupled from VGA 210 and the output signal components of VGA 210 are coupled to the auto-zero and gain calibration block 240. That is, the calibration circuits are coupled to the input and output of VGA 210. Logic block 220 then initiates reference voltage generator to apply a zero voltage as Vin_ref to the input of VGA 210. If the offset compensation value is determined for the very first time, for example after a power up, then the gain value of the VGA is set to an average value, because the gain control signals have not yet been identified. According to the zero voltage at its input VGA 210 outputs its offset voltage only, which is fed into the auto-zero and gain calibration block 240.

Depending on the received offset voltage auto-zero and gain calibration block 240 generates a control voltage Vcontrol, which is coupled to an analogue multiplexer and tuning voltage hold circuit 250, hereinafter called MUX and hold circuit 250. A reference voltage Vout_target, in this exemplifying embodiment a zero voltage, is provided by the reference voltage generator 230 via the coupling as illustrated to the auto-zero and gain calibration circuit 240 as a reference value, so that block 240 adjusts its output control voltage Vcontrol for controlling the VGA 210 to output the reference voltage. That is, if the output signals Vout_P and Vout_N of VGA 210 do not match the reference signal provided from the reference voltage generator, then the auto-zero and calibration circuit 240 adjusts its output signal Vcontrol such that VGA 210 in turn adjusts its output signal components Vout_P and Vout_N respectively. The MUX and hold circuit 250 forwards the adjusted signal value of Vcontrol to the corresponding control terminal of VGA 210 as indicated in the drawing as signal Voffset_comp. VGA 210 accordingly adjusts its output offset voltage and thus closes the feedback path to the auto-zero and gain calibration block 240, which adjusts the control signal to fully compensate the offset voltage of VGA 210.

The purpose of this MUX and hold circuit 250 is to multiplex, that is to couple via a switch, the received control voltage Vcontrol to the appropriate control terminal of VGA 210 corresponding to the control signal just determined in the current time interval. So when determining the offset compensation signal the MUX and hold circuit 250 couples signal Vcontrol as received from block 240 to the offset compensation control terminal of VGA 210. Similarly the MUX and hold circuit couples the signal to the Vtune_max or Vtune_min control terminal of VGA 210, in case the control value for the maximum or minimum gain respectively has been determined. Furthermore the MUX and hold block 250 is capable of storing values of control signals for coupling these control signals to the corresponding terminals of VGA 210. That is once the values of the control signals have been stored in the MUX and hold block 250, these are provided permanently to VGA 210.

The time interval for adjusting a value of a control signal terminates when the auto-zero and calibration signal AZCAL is reset and the auto-zero and gain calibration logic block 220 correspondingly opens switches 270 by resetting signal switch_ctrl2 to detach the auto-zero and gain calibration block 240 from the output of VGA 210 and the reference voltage generator 230 from the input of VGA 210. Also switches 260 are closed by an appropriately set switch_ctrl1 signal in order to couple the input signal to VGA 210. That is at the end of the time interval the input signal is coupled to and the blocks of the calibration circuits are decoupled from VGA 210, except the MUX and hold block 250, which is to provide the determined control signals permanently to VGA 210.

Subsequent to determining the value for the offset compensation control signal Voffset_comp a value for controlling the maximum or minimum gain of VGA 210 may be determined, wherein there is no sequence for determining either, as they do not affect each other.

That is, for example, in a following auto-zero and gain calibration phase the control value Vtune_max for controlling the maximum gain of VGA 210 is determined, i.e. calibrated, wherein the determination is triggered by the auto-zero and calibration signal AZCAL. Logic block 220 accordingly controls via signals switch_ctrl1 and switch_ctrl2, which cause switches 260 to open and switches 270 to close, the decoupling of VGA 210 from the input signal components Vin_P and Vin_N and its coupling to the auto-zero and gain calibration block 240 and the reference voltage generator 230. Reference voltage generator 230 is initiated to generate a low reference voltage Vin_ref, which is supplied to the input of VGA 210, and to generate a high reference voltage, which equals the desired output signal level of the VGA at maximum gain, and which is fed to the auto-zero and gain calibration block 240 as target signal level Vout_target. Auto-zero and gain calibration block 240, which is coupled to the output signal of the VGA, is initiated by an appropriate signal received from logic block 220 to adjust its output control voltage Vcontrol such that the output voltage of the VGA matches the target signal level Vout_target, e.g., auto-zero and gain calibration block may raise Vcontrol if the Vout_N or Vout_P are below the level of Vout_target in order to indicate that the gain should be increased. Similarly, the MUX and hold block 250 forwards the control voltage to the VGA, wherein in this case the logic block initiates the MUX and hold block 250 to couple the control voltage as signal Vtune_max to the terminal dedicated for receiving the signal adjusting the maximum gain of the VGA. In this way the value for the control signal Vtune_max can be acquired in a closed loop, thus enabling an accurate acquisition of control signal Vtune_max. Once that signal is acquired it is stored in the MUX and hold circuit 250 such that it is provided to VGA 210 permanently.

Similar as described for acquiring the control signal for the offset compensation the time interval for acquiring a control value adjusting the maximum gain of VGA is terminated when the AZCAL signal is reset. Logic block 220 accordingly resets signals switch_ctrl1 and switch_ctrl2 to decouple the reference voltage generator block 230 and the auto-zero and gain calibration block 240 from the VGA and couples the input signal to the input of VGA. Also as explicated above all input terminals of the VGA for receiving control signals are permanently coupled to the MUX and hold block 250, hence these lines remain unaffected from that switching.

For acquiring the value of the control signal Vtune_max the amplitude of the low voltage reference signal fed into VGA 210 must be small enough so as to enable the determination of the value of the control signal for maximum gain. However the low level reference signal at the same time must be big in comparison with any offset signal in the amplifier, that is in particular in the first amplification of VGA 210, because the error will maximize when determining the control value.

The value of the control signal Vtune_min can be acquired analogously as described above for Vtune_max. That is the input of VGA 210 is decoupled from the input signal and coupled to the reference voltage generator 230, and the output of VGA 210 is coupled to the auto-zero and gain calibration block 240. Logic block 220 furthermore initiates the reference voltage generator 230 to apply a high input voltage Vin_ref to the input of VGA 210 and further to apply a corresponding target voltage Vout_target to the auto-zero and gain calibration block 240. This block 240 then adjusts its output signal Vcontrol such that the amplitude of the output voltage of VGA 210 matches the applied target voltage Vout_target. MUX and hold block 250 is initiated by logic block 220 to apply the control voltage Vcontrol as control signal Vtune_min to the terminal of VGA 210 dedicated for receiving the signal adjusting the minimum gain. The determined value of control signal Vtune_min is at least then stored in the MUX and hold circuit 250 to be supplied to VGA 210 henceforth. Alternatively any intermediate value of Vtune_min can be stored in the MUX and hold block, so that in case of an unexpected end of the calibration there is at least a reasonable value stored. Again the calibration phase is terminated by an appropriately set signal AZCAL, which causes logic block 220 to decouple the auto-zero and calibration block 240 from the output of VGA 210, to decouple the reference voltage generator 230 from the input of VGA 210 and to couple the input signal, i.e. Vin_P and Vin-N, to VGA 210.

As in this case the ratio of the reference input voltage Vin_ref to the target voltage Vout_target and thus to the output voltage of the VGA 210 is high, the error comprised in the control signal Vtune_min presumably will be small.

In this way logic block 220, auto-zero and gain calibration block 240, reference voltage generator 230 and the MUX and hold block 250 can be used to initially determine the desired values of the control signals Voffset_comp, Vtune_max and Vtune_min at the beginning of operation, wherein each of the values can be stored in the MUX and hold block 250.

Once the control signals have been determined the values can be renewed as necessary using the same procedure described above, wherein in one calibration phase one or more values of control signals can be determined.

Alternatively to afore described initial mode method for updating the values the following different method is proposed, which will be called tracking mode hereinafter. As mentioned afore one cause for adjusting a value of a control signal may be that the value of the control signal may drift away from its latest set value, that is the stored value drifts for example due to leakage or any other non-ideal property of the storage means in the MUX and hold circuit 250. Another cause for updating a stored value of a control signal can be a drift of a property of the VGA 210, such that the control values follow the drift of the VGA.

In tracking mode the input of the VGA 210 is decoupled from the input, i.e. from its normal operation environment, and is coupled to the reference voltage Vin_ref of the reference voltage generator 230. Furthermore the output of the VGA is coupled to the auto-zero and gain calibration block 240, which can be achieved by setting signal AZCAL appropriately, so that the logic block 220 sets signals switch_ctrl1 and switch_ctrl2 accordingly to open switches 260 and to close switches 270. The value of the output of the VGA may be stored on storage means, for example as voltages on capacitors comprised in the auto-zero and gain calibration block. As soon as the output of the VGA is stored in the auto-zero and gain calibration block the VGA can be decoupled from the reference voltage Vin_ref and can be coupled to its normal production environment by closing switches 260 and opening switches 270 correspondingly. In this way the time span in which VGA 210 is decoupled from its normal operation environment is minimized.

Logic block 220 initiates the reference voltage generator 230 to apply an input reference voltage Vin_ref to VGA 210, wherein the input reference voltage is that as described above. That is, for tracking the offset compensating control voltage Voffset_comp a zero voltage, i.e. no voltage, is applied, a low voltage as Vref_in is applied for tracking the maximum gain control signal Vtune_max and a high voltage is applied as Vref_in for tracking the minimum gain control signal Vtune_min. Furthermore correlating target voltages are applied as Vout_target to the auto-zero and gain calibration block 250. According to its applied input voltage VGA 210 will output corresponding output voltages Vout_N and Vout_P, which are coupled as input signals to the auto-zero and gain calibration block 240.

Logic block 220 then initiates the auto-zero and gain calibration block 240 to compare the applied target voltage Vout_target with the output voltage of VGA 210 and to generate an output signal Vcontrol, wherein the signal Vcontrol indicates a binary signal, indicating whether the output voltage of the VGA is higher or lower than the applied target voltage Vout_target. That is the auto-zero and gain calibration block 240 indicates, whether the corresponding control signal Vtune_min, Vtune_max or Voffset_comp must be set higher or lower. The auto-zero and gain calibration block 240 in this way operates as a comparator and the MUX and hold circuit 250 adjusts the value of the corresponding control signal by increasing or decreasing its value by an incremental adjustment process. In this procedure the value of the control signal to be adjusted is adjusted in any case. So even if the output signal of VGA 210 matches the applied target voltage the auto-zero and gain calibration block 240 adjusts the value of the corresponding control signal by one incremental process.

The step size can be fixed or varying, wherein a varying step size can be defined according to a predefined algorithm. For example the step size can be increased from one update to the next, if a predetermined number of previous, consecutive adjustment steps have been in the same direction. For example if the previous 3 adjustment steps have increased the value of the control signal, then the step size of an adjustment step can be increased. In this way fast-drifting values may be handled by flexibly increasing the step size, such that the deviation of a value from its optimum or from its original set value does not increase with time.

The MUX and hold circuit 250 accordingly increases or decreases the value of the corresponding control signal by increasing or decreasing its stored value by one step. Numerous ways are known to stepwise in- or decrease a control voltage provided to a device. If for example a capacitor is used to store a determined value of a control voltage, then a charge pump may be triggered to in- or decrease the charge on the capacitor to thereby in- or decrease the voltage stored.

Amending the value of a control signal by one step of predefined step size provides a more controllable and faster change of the output signal of VGA 210. That is, if we look at the offset voltage in the output signal of the VGA, then the offset voltage can only vary in predefined limits, even if for an optimal compensation the step should have been wider. In this way a smooth alignment between the output signal and the generated reference voltage Vout_target can be achieved.

For both modes, that is the initial mode for acquiring the initial values of the control signals and the tracking mode for updating these values, the same auto-zero and gain calibration block 240 can be used. When considering the elimination of offset voltages of VGA 210 the offset voltages of the auto-zero and gain block 240 can be considered also, as the offset voltage of this block may affect the determination of all control signals. The offset voltages of the auto-zero and gain calibration block 240 can be compensated with any conventional circuit. So as the time intervals between subsequent auto-zero and/or calibration phases presumably will last significantly longer than the auto-zero and/or calibration phases itself, there is enough time to compensate the offset of block 240 between these phases. Block 240 itself will thus have almost no or a negligible offset voltage.

Accordingly before determining control signal Voffset_comp, that is before the next auto-zero phase for determining the control signal for compensating the offset of VGA 210 is started, the offset of block 240 can be compensated, wherein the offset compensation is performed for a zero signal, i.e. no voltage. That is, the offset of block 240 is compensated with reference to the target voltage in the next auto-zero and calibration phase. Similarly the offset of block 240 can be compensated with reference to the next auto-zero or calibration phase, which is with reference to the next target voltage. In the auto-zero or calibration phase the comparison between the feedback voltage and the applied target voltage can be performed as a null balance. In this way block 240 can be offset calibrated specifically for the signal level in the next auto-zero or calibration phase.

The reference voltage generator 230 generates the reference voltage Vin_ref coupled to VGA 210 as well as the desired target voltage Vout_target, which is expected from the VGA 210 during a calibration phase. In case of a calibration phase for determining the control signal for maximum gain generator 230 generates a low voltage as Vin_ref and a high voltage as Vout_target. The ratio of these voltages can be adjusted for example by using a voltage divider, such that the ratio of the voltages corresponds to the ratio of the resistances in the voltage divider, which can be manufactured with high precision.

Figure 3:
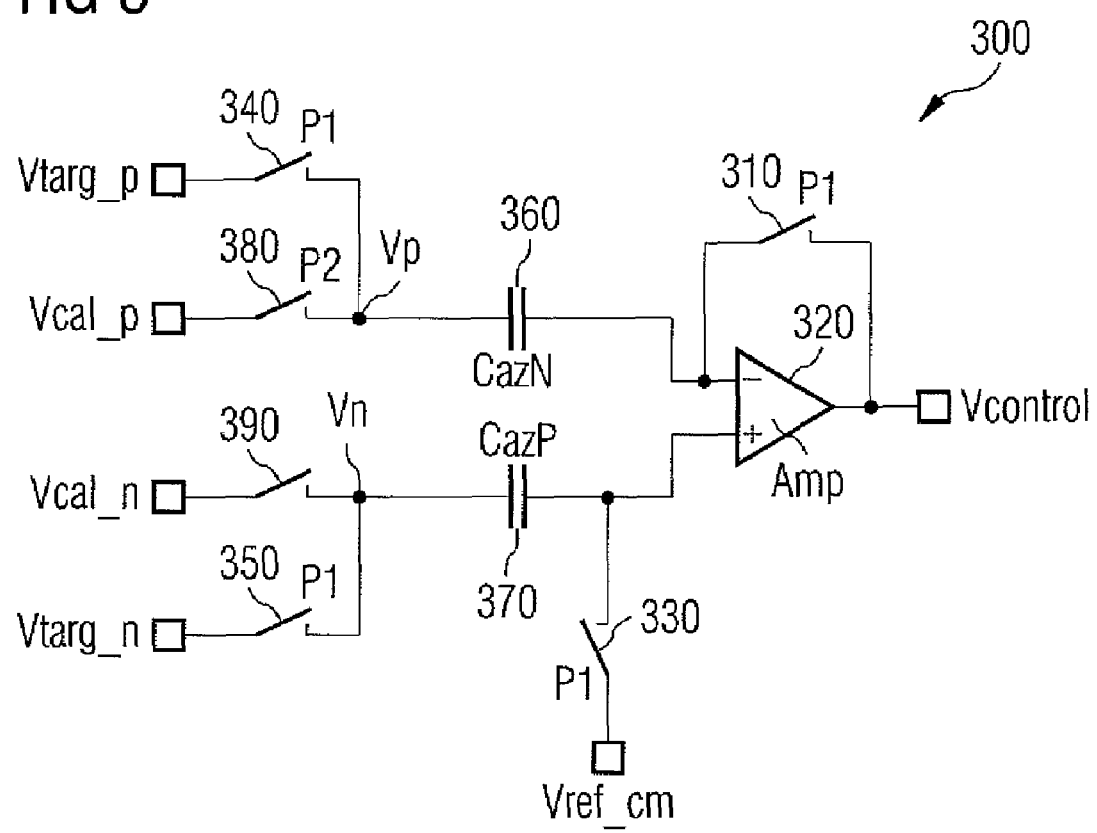
FIG. 3 illustrates schematics of an integrated circuit including an auto-zero and gain calibration circuit using an analog approach.

FIG. 3 illustrates an example embodiment of an auto-zero and gain calibration circuit 300, which corresponds to block 240. The circuit includes an amplifier 320, two auto-zero capacitors CazN 360 and CazP 370 and a set of switches 310, 330 and 340 that are used to perform the offset compensation operation of circuit 300. In initial mode amplifier 320 works in a closed-loop including AC coupling capacitors CazN 360 and CazP 370, the MUX and hold circuit 250 and the VGA 210. In this loop an analog control signal Vcontrol is generated to settle the auto-zero and calibration signals Voffset_comp, Vtune_max and Vtune_min. In initial mode the switches controlled by signal P1 are open and switches controlled by signal P2 are closed.

In tracking mode the amplifier 320 works as a comparator to derive a logical output Vcontrol depending on the polarity of the error voltage between the output of the VGA and the reference target voltage Vout_target. With respect to the function as comparator two modes are possible. In a first mode the comparison is performed directly within the auto-zero and calibration phase, determined by the signal AZCAL. This mode shall further on be named direct tracking mode. Alternatively, a so called indirect tracking mode can be obtained in which the comparison is performed outside of an auto-zero and gain calibration interval, i.e. when signal AZCAL is not set. These modes differ only by the sequence in which the switch control signals P1 and P2 are applied to the circuit 300.

In initial and both tracking modes it is mandatory to minimize contributions of non-ideal properties of the amplifier 320, like an input offset voltage Voffset. In normal operation the input terminals of VGA 210 are coupled to the input signal to be amplified, namely signal components Vin_P and Vin_N, and is decoupled from the auto-zero and gain calibration circuit 300. As mentioned above during this time an offset calibration of circuit 300 can be performed, wherein the offset compensation is performed using the specific target voltage of the next auto-zero or gain calibration phase.

The method for offset compensation of circuit 300 is different depending on which mode has to be performed. If an initial calibration or a direct tracking mode has to be performed then the differential reference voltage has to be stored on the AC coupling capacitors CazN 360 and CazP 370 together with the input offset voltage of amplifier 320 during the offset compensation phase of block 240 circuit 300 that is prior to the next auto-zero and gain calibration phase. In case an indirect tracking has to be performed the offset compensation of block 240 using circuit 300 can be performed by storing on the AC coupling capacitors both VGA output voltages as well as the input offset voltage of amplifier 320 in the auto-zero and gain calibration phase.

First a detailed description of the offset compensation of circuit 300 prior to an initial or a direct tracking mode will be presented. During offset compensation phase P1 of circuit 300 a switch 310 in the negative feedback path around amplifier 320 is closed. The positive input terminal of amplifier 320 is coupled to reference voltage Vref_cm by closing switch 330, which may be coupled to the same switch control signal as switch 310. Accordingly amplifier 320 will set the voltage at its negative input also to Vref_cm. Furthermore the input terminals of circuit 300 are coupled to the target voltages as desired in the next auto-zero or gain calibration phase of the VGA. That is a target voltage Vtarg_p being the positive signal of the differential reference input signal is coupled to node Vp of circuit 300 by closing switch 340. By closing switch 350 a corresponding negative signal of the differential reference input signal is coupled as target voltage Vtarg_n to node Vn of circuit 300. The capacitors CazN 360 and CazP 370 are charged to the difference between the common-mode voltage Vref_cm and the positive and negative reference input signal respectively. Should amplifier 320 exhibit an offset voltage then this offset voltage will also be present at capacitor CazN. That is because output voltage Vcontrol will be offset to Vref_cm by the input offset voltage Voffset of amplifier 320. The input differential voltage on the left side of the capacitors is determined to match the reference target voltage Vout_target while the differential voltage on the right side of the capacitors matches the amplifier offset voltage closely if the gain of the amplifier is high. By choosing a suitable gain of amplifier 320, e.g., >60 dB, it is possible to accurately compensate any input offset voltage. The reference voltage Vref_cm should be chosen close to the expected offset and gain tuning signals Voffset_comp, Vtune_max or Vtune_min such that amplifier 320 does only need to perform a minor adjustment of its output level hence keeping the required differential voltage at its input terminals negligible. An amplifier with high gain serves best. This is especially true in tracking mode as control signal Vcontrol then approaches large levels to allow digital processing by the MUX and hold circuit 250.

The voltage difference Vtarg_n−Vref_cm is stored as charge on capacitor CazP 370 and voltage difference Vtarg_p−(Vref_cm−Voffset) is stored as charge on capacitor CazN 360, wherein the input voltages Vtarg_n and Vtarg_p can be chosen arbitrarily, for example corresponding to the desired target voltages in the next auto-zero or calibration phase.

Subsequently, in the next auto-zero or gain calibration phase, switches 310, 330, 340 and 350 are opened, such that voltages Vtarg_n, Vtarg_p and Vref_cm are decoupled from amplifier 320 and capacitors CazN 360 and CazP 370, wherein the charges remain on the capacitors. This also holds the offset voltage Voffset of amplifier 320 on the capacitors. By closing switches 380 and 390 input signals Vcal_p and Vcal_n are coupled to circuit 300, wherein the switches can be closed by an appropriate signal P2. As in an auto-zero and calibration phase the input signals of the block 240 and thus circuit 300 are coupled to the output signals of VGA 210, the input signals Vcal_p and Vcal_n of circuit 300 thus are the output signals of VGA 210.

In case that the voltage Vcal_p−Vcal_n exceeds the stored target voltage Vtar_p−Vtarg_n, then amplifier 320 is driven positively and will generate a negative output voltage Vcontrol smaller than Vcm_ref. Vice versa amplifier 320 will generate a positive output voltage exceeding Vcm_ref as Vcontrol in case that the voltage difference Vcal_p−Vcal_n is below the voltage Vtarg_p−Vtarg_n, which drives the amplifier negatively and which will cause a positive value for Vcontrol. Whether to apply VGA 210 output signals Vout_P and Vout_N directly to Vcal_p or Vcal_n respectively depends on how the MUX and hold circuit 250 and the VGA 210 process Vcontrol. To get correct (negative) feedback operation an inversion at the inputs of circuit 300 may apply. The auto-zero and gain calibration circuit 300 signals the Vcontrol value to the MUX and hold circuit 250, which will accordingly increase or decrease the values of Voffset_comp or Vtune_min or Vtune_max.

In this way each of the control voltages Vtune_min, Vtune_max and Voffset_comp can be acquired using the same circuit 300 by charging the capacitors in circuit 300 using the desired target voltage. This procedure may be performed each time a new value for any of the control voltages is to be determined, that is for acquiring the values initially and subsequently for tracking drifting values.

A slight modification of the sequence the switches are operated on applies to indirect tracking mode. In this case the amplifier offset voltage is stored on capacitors CazP and CazN during the offset and gain calibration phase, i.e. when control signal AZCAL is set, by closing switches 310 and 330. This sets the common-mode voltage at the amplifier's positive input to Vref_cm and its negative input to Vref_cm−Voffset, should the amplifier exhibit and input offset voltage Voffset. The input signals Vcal_p and Vcal_n are coupled to the VGA 210 output voltages. Thus the differential output voltage of the VGA is sampled on the capacitors CazP and CazN as well as the offset voltage of amplifier 320. With the end of the gain and offset compensation phase, i.e. when signal AZCAL is un-selected and switches 310, 330, 380 and 390 are opened accordingly, the charge is kept on the capacitors and hence the VGA's differential output voltage as well as the input offset voltage of amplifier 320.

Indirect tracking is performed by comparing this information to a reference voltage target Vout_target. That is by closing switches 340 and 350 the voltage at the left side of capacitors CazP and CazN is forded to the reference voltage target. In case the hold differential voltage does not match to the reference voltage a differential voltage will be forced on the inputs of amplifier 320 through AC coupling capacitors CazP and CazN. The polarity of this signal depends on the polarity of the error voltage obtained as difference between Vout_target and VGA's output voltage at the instance when signal AZCAL changes to non-selected. Such the output of the amplifier will rise or fall.

If sufficient gain is provided by the amplifier, e.g., >60 dB, and if the AC coupling capacitors CazP and CazN are dimensioned large compared to the input capacitance of the amplifier 320, of switches 310 and 330 in off-state as well as the parasitic capacitances at the amplifier input nodes then even small error voltages can be processed. As an example the capacitors should typically be selected 10 times larger than the sum of the parasitic and circuit capacitances at the amplifier input nodes. If furthermore enough time is provided compared to the bandwidth of amplifier 320 then the output voltage Vcontrol can settle to large values even with smallest input error voltages. Such amplifier 320 works as comparator. An easy digital processing of signal Vcontrol is possible.

Note that with respect to operation as comparator there is a significant difference between direct and indirect tracking mode. The time required to generate a large output signal Vcontrol depends on the bandwidth of amplifier 320 and the input signal to the amplifier. In case of very small input signals and taking into consideration that VGA 210 performs a settling of its output voltage when driven by a reference voltage there may not be enough time to settle signal Vcontrol to a level large enough to perform easy digital processing by the MUX and hold circuit 250 at the end of an auto-zero and gain calibration phase. As system operation usually requires minimum time for auto-zero and gain calibration phases it might be impossible to perform direct tracking mode. Indirect tracking uses the significantly longer time available outside of the auto-zero and gain calibration phases to generate a large signal Vcontrol. Digital processing of signal Vcontrol can be performed at the beginning of the next auto-zero and gain calibration phase. Comparatively fast incremental update of signals Vtune_min, Vtune_max and Voffset_comp is possible and changes of gain or offset voltage will fall within the settling of VGA output voltage to the calibration target.

For tracking the drift of a control signal the above explicated direct and indirect tracking mode can be used alternatively, wherein auto-zero and gain block 240 is operated as a comparator, which outputs a signal initiating a stepwise increase or decrease of the corresponding control signal. In this case the output signal Vcontrol can be further processed by a following digital circuit, which initiates to stepwise increase or decrease a stored signal of Voffset_comp or Vtune_max or Vtune_min in the MUX and hold block 250.

Figure 4:
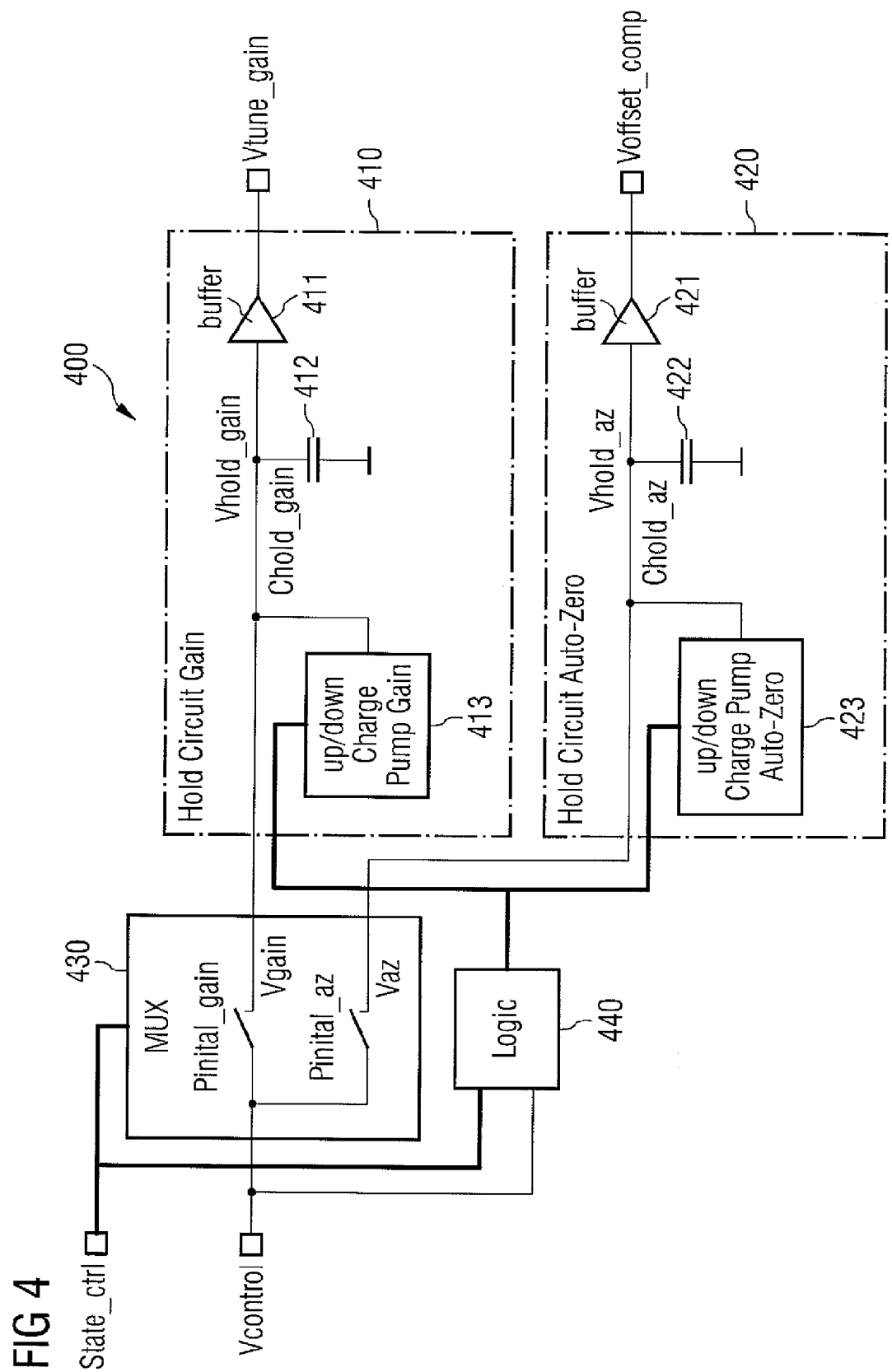
FIG. 4 illustrates a schematic of a MUX and hold circuit.

FIG. 4 illustrates one exemplifying embodiment 400 of the analogue MUX and tuning voltage hold circuit 250. For simplification circuit 400 includes a hold circuit 410 for a single gain control signal as required in a fixed-gain amplifier and a hold circuit 420 for the auto-zero control signal. One skilled in the art will see that this circuit can be extended to a MUX and hold circuit including sub-blocks for multiple gain tuning signals. Besides this an analog MUX 430 for multiplexing the control signal Vcontrol to the internal hold nodes Vhold_gain and Vhold_az and a logic block 440 for control of circuit operation during tracking mode are available.

Circuit 400 includes a multiplexer 430 coupled to the auto-zero and gain calibration logic block 220 by a line providing control signal State_ctrl as indicated in FIG. 2. According to the control signal received from block 220 the multiplexer couples one of its output terminals for Vtune_gain or Voffset_comp through buffers 411 and 421 to its input Vcontrol to forward the Vcontrol signal to VGA 210. Actually buffers 411 and 421 are operational amplifiers as illustrated in the figure, which have an indefinite input resistance, thus do not discharge a capacitor, and provide the voltage of the capacitor at the output, so that the voltage of a capacitor is buffered. Furthermore circuit 400 includes means for storing a value of a control voltage. In its simplest embodiment capacitors 412 and 422 can be used for storing one value of a control value, wherein the voltage, which corresponds to its charge, represents the latest value of the control signal. For example in order to store a voltage of a control signal a capacitor may be charged up to this voltage. The voltage on the capacitor may then be buffered and coupled to a corresponding terminal of VGA 210 in order to provide the voltage permanently. Alternatively the capacitor can be coupled permanently to the corresponding output terminal, such that it is charged by the applied control signal Vcontrol.

Due to its non-ideal nature the voltage of the capacitor will drift, for example because of internal leakage currents decreasing the charge. Accordingly the charge on a capacitor must be refreshed or a new charge representing a new value of the control signal is to be stored on the capacitor.

In initial mode the charging of the capacitors is done within a single auto-zero and gain calibration phase and tuning or offset compensation voltages are fully settled. During tracking modes, i.e. either in direct or indirect tracking mode, the charge on the hold capacitors 412 and 422 is refreshed repetitively. This can e.g., be performed by adding or subtracting an incremental amount of charge to the hold capacitors by using a charge pump. For example for each hold circuit in FIG. 4 a charge pump 413 and 423 respectively can be implemented. The amount of charge provided by both charge pumps determines the voltage incrementing the tuning signals. For smooth variation it can be set to a small value determined by the amount of drift on the capacitor and the requirements to react on differing environmental conditions, like temperature changes.

Afore described circuits can be used for amplifying an input signal, wherein the input signal can be a differential signal or a non-differential signal that is a single-ended signal. In case a single-ended input signal is to be processed, afore described circuits are to be amended as mentioned in short above. Substantially one input line is replaced by a reference voltage, for example ground potential.

Various gain tuning and offset compensation signals can be generated applying the principles described afore. In this way proper tuning signals and offset compensation signals for a variable gain or a fixed gain amplifier can be produced. Furthermore, the scope of the invention is not limited to amplifiers. Any circuit requiring exact gain control can be accompanied by the mentioned calibration circuits. As another example a continuous time filter (CTF) can be mentioned. The invention is not limited to high-speed circuits but specially suits the requirements in such a circuit class.

In afore described circuits the auto-zero and gain calibration is controlled by a state signal AZCAL that can be issued e.g., by another logic block as often present in a large mixed-signal circuit. The state signal AZCAL for example can be applied through a dedicated signal connector of the circuit, which may be implemented as a dedicated pin of a chip. Accordingly only one control line AZCAL is required to stir offset and gain calibration.

Afore described circuit uses an analog approach in the implementation of the calibration scheme, i.e. opening signal path, applying an input reference voltage to the VGA, sensing the VGA output voltage and correcting for deviation of the VGA output voltage from a reference target. A digital approach can alternatively be implemented in case multiple control lines including a clock signal can be generated e.g., by a higher level logic block.

Figure 5:
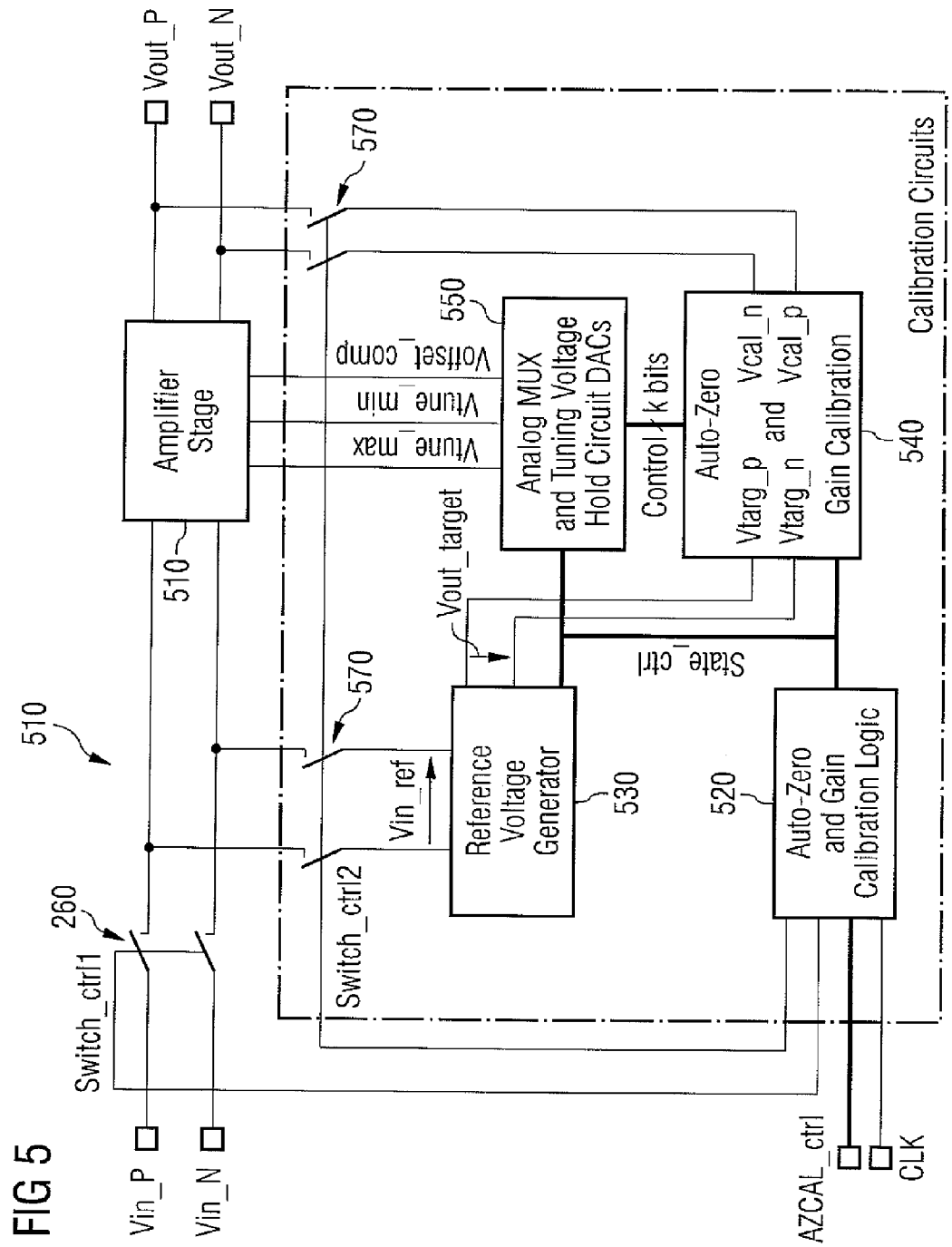
FIG. 5 illustrates schematics of an auto-zero and gain calibration circuit using a digital approach.

FIG. 5 illustrates an exemplary circuit 500 of a digital approach to auto-zero and gain calibration, wherein some included elements like switches 560, 570 are identical to those described in the previous embodiments and the reference voltage generator 530 is controlled by a digital value.

The control of the calibration circuits is now triggered by one or more state control signals AZCAL_ctrl and a clock CLK. That is auto-zero and gain calibration block 540 provides a digital signal of for example k bits, which corresponds to the analog signal Vcontrol in FIG. 2, to the analog MUX and hold circuit 550. The auto-zero and gain calibration unit 540 compares voltages Vout_target and the output voltage of the amplifier 510 and may include a comparator that delivers the polarity of the error signal and a logic that controls the MUX and hold circuit via a k bit wide digital interface. The MUX and hold circuit 550 may include a set of Digital-to-Analogue Converters (DACs), one for each tuning or offset signal, which convert the provided signal to a voltage supplied as control signal to amplifier 510. With these two units settling the tuning signals can performed during initial mode, controlled by logic block 520, e.g., using a successive approximation or binary search algorithm. During tracking mode an incremental update can be done e.g., by altering the DAC value by e.g., an LSB (least significant bit) process or by larger processes if applicable.

An Analog-to-Digital Converter (ADC) may also be part of the auto-zero and gain calibration block 540 to convert the analogue output voltage of the amplifier 510 into a digital code that can then be compared to a digital target for the output voltage.

As illustrated in FIG. 6 the mentioned ADC may not always be part of the calibration circuit. It is possible to reuse an existing ADC in a signal path including an amplifier stage 610 coupled to further analogue processing circuits 680 and an ADC 690. During calibration the amplifier 610 is disconnected from the input lines by switches 660 and reference circuit 630 is connected to VGA to drive VGA with a reference voltage. The update of the gain and offset control signals is now based on the digital output of the ADC, which is in reference to provided reference voltages of the ADC. These can be derived by the reference circuit 630. In this embodiment an auto-zero and gain calibration logic block provides a signal State_ctrl to reference voltage generator 630, the MUX and tuning voltage hold circuit 650 and auto-zero and gain calibration circuit 640, wherein the State_ctrl signal may be a digital signal. Reference voltage generator 630 accordingly generates voltage Vin_ref coupled to the input of the amplifier, but does not provide a target signal to auto-zero and gain calibration block 640. As signal State_ctrl includes information about the desired target voltage, i.e. the desired output voltage of the amplifier, the auto-zero and gain calibration block extracts this information from State_ctrl and compares this to the output signal of ADC 690 for determining a control signal provided to the MUX and tuning voltage hold circuit 650. Compensation of offset and gain is such extended beyond a single amplifier to the level of a full signal-path (or a part of a signal-path) and may include additional analog blocks, e.g filters as well as the ADC.

The digital approach benefits an infinite hold capability. No drift will occur on the outputs of the DACs used to provide the tuning signals. Nevertheless repetitive update is required to obtain drift control of the VGA parameters. On the other hand a more sophisticated control scheme to synchronize clocks and state control signals has to be provided by a circuit external to the auto-zero and gain calibration unit.

Generally the circuits can be used in any circuit, in which a signal is to be amplified. For example the circuit can be used in an application to read/write data to/from a hard disk drive in a computer, wherein signal speeds of up to 3 GHz have been processed while at the same time the signals where amplified accurately. As in these or similar applications the stream of signals may stop, for example when the read/write head is positioned mechanically on the disks of the hard drive, an auto-zero or calibration phase can be performed in these breaks, such that there is no need to stop the processing of signals exclusively for offset compensation and gain calibration.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   an amplifier configured to amplify an input signal;
   a calibration circuit; and
   a tuning voltage hold circuit coupled to the calibration circuit and to the amplifier, wherein the amplifier comprises a plurality of control terminals for receiving a plurality of control signals from the tuning voltage hold circuit to control at least one of an offset voltage or the maximum gain or minimum gain of the amplifier, wherein the tuning voltage hold circuit comprises a storage device for each of the plurality of control signals and wherein the tuning voltage hold circuit is coupled via a multiplexer to the calibration circuit for coupling control signals to the storage devices.

2. The integrated circuit of claim 1, wherein the tuning voltage hold circuit comprises an operational amplifier or buffer coupled to a capacitor to provide a control signal to the amplifier without loss.

3. An integrated circuit comprising:
a fixed or variable gain amplifier for amplifying an input signal;
a calibration circuit connectable to the output of the amplifier and providing an output signal indicating the ratio of a first input signal and the output signal of the amplifier;
a reference signal generator providing a target signal as the first input signal to the calibration circuit and connectable to the amplifier to provide a reference input signal to the input of the amplifier; and
a tuning voltage hold circuit coupled to the output of the calibration circuit and to the amplifier to permanently provide a control signal controlling at least one of an offset voltage or the maximum gain or minimum gain of the amplifier, wherein the tuning voltage hold circuit comprise at least one storage device for storing the control signal and the at least one storage device is a capacitor, wherein the amplifier comprises a plurality of control terminals for receiving a plurality of control signals and wherein the tuning voltage hold circuit comprises a storage device for each of the control signals and wherein the tuning voltage hold circuit is coupled via a multiplexer to the calibration circuit for coupling control signals to the storage devices.

4. The integrated circuit of claim 3, wherein the tuning voltage hold circuit comprises an operational amplifier or buffer coupled to the capacitor to provide a control signal to the amplifier without loss.

5. The integrated circuit of claim 3, wherein the tuning voltage hold circuit comprises a charge pump for increasing or decreasing the voltage on the capacitor according to a control signal of the calibration circuit.

6. The integrated circuit of claim 5, wherein the calibration circuit is a comparator providing a signal to the tuning voltage hold circuit indicating to increase or decrease one of the control signals and wherein the tuning voltage hold circuit increases or decreases the voltage of the capacitor by a small amount.

7. The integrated circuit of claim 3, comprising a logic circuit controlling switches for decoupling the input signal from the amplifier and coupling the reference input signal to the amplifier and for coupling the output of the amplifier to the calibration circuit, the logic circuit furthermore coupled to the reference signal generator and to the tuning voltage hold circuit and to the calibration circuit for providing the control signal.

8. The integrated circuit of claim 3, wherein the calibration circuit comprises at least one storage device for storing an output value of the amplifier.

9. The integrated circuit of claim 8, wherein the at least one storage device for storing an output value of the amplifier is a calibration circuit capacitor.

10. The integrated circuit of claim 9, wherein the calibration circuit capacitor can also be used for compensation of offset voltages present in the calibration circuit.

11. An integrated circuit comprising:
a fixed or variable gain amplifier for amplifying an input signal;
a calibration circuit connectable to the output of t e amplifier and providing an output signal indicating the ratio of a first input signal and the output signal of the amplifier;
a reference signal generator providing a target signal as the first input signal to the calibration circuit and connectable to the amplifier to provide a reference input signal to the input of the amplifier; and
a tuning voltage hold circuit coupled to the output of the calibration circuit and to the amplifier to permanently provide a control signal controlling at least one of an offset voltage or the maximum gain or minimum gain of the amplifier, wherein the calibration circuit comprises at least one analog-to-digital converter or at least one comparator and a logic for providing a digital signal to the tuning voltage hold circuit, and wherein the tuning voltage hold circuit comprises at least one digital-to-analog converter to convert the provided digital signal to an analog control signal provided to the amplifier.

12. A method for operating an integrated circuit including calibrating a fixed or variable gain amplifier comprising:
providing a reference input signal to the input of the amplifier;
coupling the output signal of the amplifier to an auto-zero and gain calibration circuit as a first input signal;
providing a target signal to the auto-zero and gain calibration circuit as second input signal, the auto-zero and gain calibration circuit outputting a control signal indicating the difference between its input signals; and
providing the control signal to the amplifier to adjust the output of the amplifier to match the reference target signal, wherein the reference input signal is defined as either
a low voltage signal and the target signal is a high voltage signal to determine a control signal for adjusting the maximum gain of the amplifier, or
a high voltage signal and the target signal is a low voltage signal to determine a control signal for adjusting the minimum gain of the amplifier, or
wherein the reference input signal and the target signal are equal in a differential manner to determine a control signal for adjusting the offset compensation of the amplifier.

13. The method of claim 12, further comprising storing the determined control signal in a storage device for being provided permanently to the amplifier.

14. The method of claim 12, comprising digitizing the output signal of the amplifier before being coupled to the auto-zero and gain calibration circuit and wherein the target signal is provided as a digital signal to the auto-zero and gain calibration circuit.

15. The method of claim 12, comprising coupling the control signal as output from the calibration circuit to a tuning voltage hold circuit for storing and permanently providing the signal to the amplifier.

16. The method of claim 15, comprising wherein the control signal as output from the calibration circuit is a digital signal and wherein the signal is converted to an analog signal in the tuning voltage hold circuit.

17. The method of claim 15, comprising triggering the auto-zero and gain control phase by a single digital control signal.

18. The method of claim 12, further comprising decoupling the amplifier from a production environment, and coupling the amplifier to its production environment, wherein the output of the amplifier is stored in the auto-zero and gain calibration circuit.

19. A method for calibrating a fixed or variable gain amplifier comprising:
providing a reference input signal to the input of the amplifier;
coupling the output signal of the amplifier to a comparator circuit as a first input signal;

providing a target signal to the comparator circuit as a second input signal;

increasing or decreasing a control signal provided to amplifier VGA corresponding to the output of the comparator circuit by one adjustment step of small step size; and increasing or decreasing the step size of an adjustment step if a predefined number of previous, consecutive adjustment steps have increased or decreased the value of the control signal.

20. The method of claim 19, comprising storing the control signal in a storage device for being provided permanently to the amplifier.

21. The method of claim 19, comprising triggering an auto-zero and gain control phase by a single digital control signal.

22. The method of claim 19, further comprising:

decoupling the amplifier from a production environment; and coupling the amplifier to its production environment, wherein the output signal of the amplifier is stored in the comparator circuit.

* * * * *